(12) United States Patent
Spath

(10) Patent No.: US 8,921,704 B2
(45) Date of Patent: Dec. 30, 2014

(54) PATTERNED CONDUCTIVE POLYMER WITH DIELECTRIC PATCH

(71) Applicant: Todd Mathew Spath, Hilton, NY (US)

(72) Inventor: Todd Mathew Spath, Hilton, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 13/850,315

(22) Filed: Mar. 26, 2013

(65) Prior Publication Data

US 2014/0290988 A1 Oct. 2, 2014

(51) Int. Cl.
*H05K 1/09* (2006.01)
*H05K 3/10* (2006.01)

(52) U.S. Cl.
CPC ... *H05K 1/09* (2013.01); *H05K 3/10* (2013.01)
USPC ............................ 174/257; 174/250; 174/256

(58) Field of Classification Search
USPC .......................................... 174/250, 255–257
See application file for complete search history.

(56) References Cited

U.S. PATENT DOCUMENTS

| 2012/0261172 A1* | 10/2012 | Yang .............................. 174/257 |
| 2012/0273336 A1* | 11/2012 | Kuriki ........................... 200/600 |
| 2013/0092426 A1* | 4/2013 | Wu et al. ........................ 174/257 |
| 2013/0105207 A1* | 5/2013 | Yamasaki et al. ............. 174/257 |
| 2013/0295354 A1* | 11/2013 | Guntermann et al. ......... 428/212 |
| 2014/0116754 A1* | 5/2014 | Gao et al. ....................... 174/250 |
| 2014/0158400 A1* | 6/2014 | Wolk et al. .................... 174/250 |

* cited by examiner

*Primary Examiner* — Hoa C Nguyen
(74) *Attorney, Agent, or Firm* — Raymond L. Owens

(57) ABSTRACT

A patterned conductive structure includes a transparent substrate having a substrate surface. A conductive polymer layer is formed on the substrate surface. The conductive polymer layer has electrically conductive areas and deactivated areas that are less electrically conductive than the conductive areas. The conductive areas and the deactivated areas form a conductive pattern in the polymer layer. One or more transparent dielectric patches that are less electrically conductive than the deactivated areas are formed over at least a portion of one or more deactivated areas and one or more conductive wires are formed over at least one of the dielectric patches.

18 Claims, 7 Drawing Sheets

PATTERNED CONDUCTIVE POLYMER WITH DIELECTRIC PATCH

FIELD OF THE INVENTION

The present invention relates to transparent patterned polymer conductors with auxiliary wires electrically isolated from the transparent conductive polymer.

BACKGROUND OF THE INVENTION

Transparent conductors are widely used in the flat-panel display industry to form electrodes for electrically switching light-emitting or light-transmitting properties of a display pixel, for example in liquid crystal or organic light-emitting diode displays. Transparent conductive electrodes are also used in touch screens in conjunction with displays. In such applications, the transparency and conductivity of the transparent electrodes are important attributes. In general, it is desired that transparent conductors have a high transparency (for example, greater than 90% in the visible spectrum) and a low electrical resistivity (for example, less than 10 ohms/square). Auxiliary electrodes or wires are used in conjunction with transparent conductive oxides to provide additional conductivity, particularly in areas of a substrate that are not visible to a user.

Conventional transparent conductors are typically coated on a substrate to form a patterned layer of a transparent, conductive material, such as indium tin oxide or other metal oxides, using for example sputtering and photo-lithographic processes. Such materials are increasingly expensive and relatively costly to deposit and pattern. Moreover, metal oxides have a limited conductivity and transparency, and tend to crack when formed on flexible substrates.

Referring to FIG. 4, a prior-art conductive structure includes a substrate 40 with a substrate surface 41. A patterned layer of a transparent conductive oxide 24, such as indium tin oxide, is formed on substrate surface 41, for example by sputtering material onto substrate surface 41 and then photo-lithographically patterning the sputtered material. Photo-lithographic techniques such as blanket coating with a UV-sensitive resin, pattern-wise exposing the resin, washing the unexposed resin to expose the sputtered material layer, etching the exposed sputtered material layer, and stripping away the exposed resin are well known in the integrated circuit manufacturing arts.

A patterned wire 50 is formed on the substrate surface 41 in the substrate areas without conductive material. If the substrate 40 is formed from a non-conductive material, the patterned wire 50 is electrically isolated from the transparent conductive oxide 24. However, sputtering materials is slow and expensive and the photo-lithographic patterning includes many steps, increasing the cost of such patterned conductive structures. Furthermore, transparent conductive oxides tend to crack when exposed to mechanical stress and are therefore problematic when combined with a flexible substrate 40.

Referring to FIG. 5, another prior-art conductive structure includes a substrate 40 with a substrate surface 41. A patterned layer of a conductive polymer 20, such as polyethylene dioxythiophene (PEDOT), is formed on substrate surface 41, for example by coating onto substrate surface 41 and then pattern-wise exposed to a deactivating agent to form conductive areas 21 and less-conductive deactivated areas 22. A patterned wire 50 is formed on a deactivated area 22, for example using photo-lithographic methods or patterned deposition methods such as screen printing or inkjet deposition. However, deactivated area 22 of conductive polymer layer 20 retains some conductivity so that patterned wire 50 is not completely electrically isolated from conductive areas 21. Thus, leakage current 60 can flow between electrically active elements (e.g. wires 50 or conductive areas 21).

There is a need, therefore, for an improved transparent conductive structure.

SUMMARY OF THE INVENTION

In accordance with the present invention, a patterned conductive structure comprises:

a transparent substrate having a substrate surface;

a conductive polymer layer formed on the substrate surface, the conductive polymer layer having electrically conductive areas and deactivated areas that are less electrically conductive than the conductive areas, the conductive areas and the deactivated areas forming a conductive pattern in the polymer layer;

one or more transparent dielectric patches that are less electrically conductive than the deactivated areas formed over at least a portion of one or more deactivated areas; and one or more conductive wires formed over at least one of the dielectric patches.

The present invention provides a transparent, patterned, electrically conductive polymer layer with electrically conductive wires electrically isolated from the conductive polymer layer.

BRIEF DESCRIPTION OF THE DRAWINGS

The above and other features and advantages of the present invention will become more apparent when taken in conjunction with the following description and drawings wherein identical reference numerals have been used to designate identical features that are common to the figures, and wherein.

Figure 1:
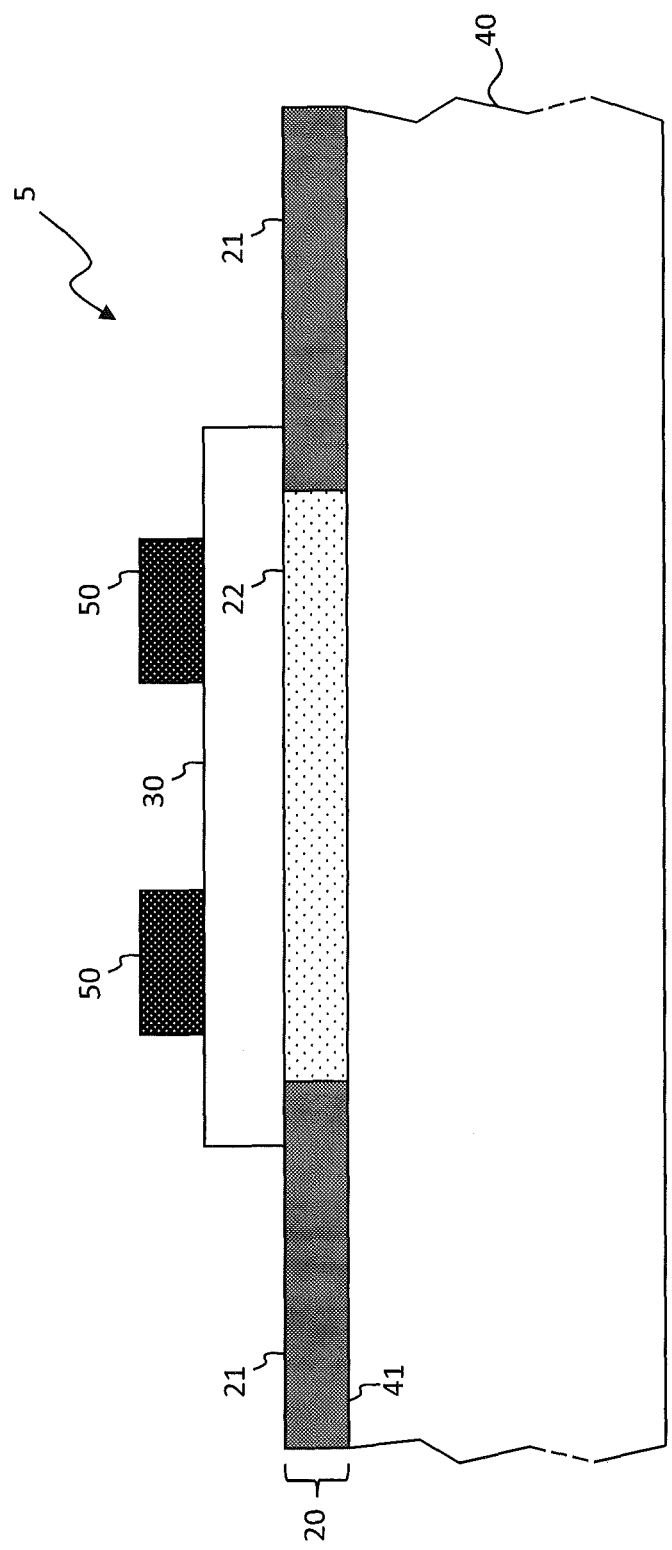
FIG. 1 is a cross section of an embodiment of the present invention.

The Figures are not necessarily to scale, since the range of dimensions in the drawings is too great to permit depiction to scale.

DETAILED DESCRIPTION OF THE INVENTION

The present invention is directed toward patterned electrically conductive structures formed on a substrate that are capable of conducting electrical currents. The patterned electrically conductive structures provide improved transparency, flexibility, and electrical isolation between conductive elements in the structure.

Referring to FIG. 1 in an embodiment of the present invention, a patterned conductive structure 5 includes a substrate 40 having a substrate surface 41. A conductive polymer layer 20 is formed on substrate surface 41, conductive polymer layer 20 having electrically conductive areas 21 and deactivated areas 22 that are less electrically conductive than conductive areas 21. Conductive areas 21 and deactivated areas 22 form a conductive pattern 10 (shown in the plan view of FIG. 3) in conductive polymer layer 20. One or more dielectric patches 30 that are less electrically conductive than deactivated areas 22 are formed over at least a portion of one or more deactivated areas 22 but less than all of conductive polymer layer 20. One or more conductive wires 50 are formed over at least one of dielectric patches 30.

The terms "relatively more conductive", "more electrically conductive", "relatively less conductive", or "less electrically conductive" simply refer to the relative electrical conductivity of conductive areas 21, deactivated areas 22, and dielectric patch 30. A higher conductivity is equivalent to a lower resistance. Similarly, a lower conductivity is equivalent to a higher resistance.

Figure 5:
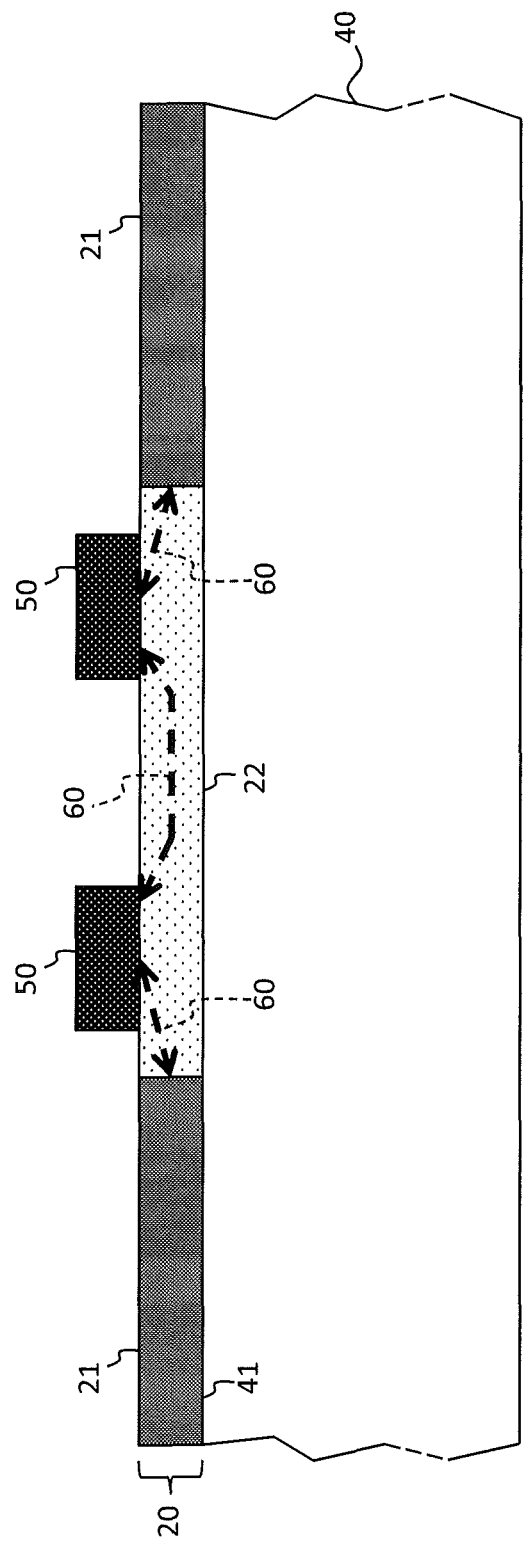
FIG. 5 is a cross section of another patterned conductive structure known in the prior art.

As taught in the present invention, conductive area 21 has a higher conductivity than deactivated area 22. Deactivated area 22 has a higher conductivity than dielectric patch 30. No absolute conductivity values are required in the present invention, although deactivated area 22 has at least a very small conductivity, for example a resistivity less than 1 trillion ohms per square, less than 1 billion ohms per square, less than 100 million ohms per square, less than 10 million ohms per square, or less than 1 million ohms per square. In various embodiments, conductive areas 21 have a resistance of 10,000 ohms per square or less while deactivated areas 22 have a resistance of 100,000 ohms per square or more. Dielectric patches 30 have a resistance of 1,000,000 ohms per square or more. Since dielectric patches 30 have a conductivity that is less than deactivated areas 22, leakage currents 60 (shown in FIG. 5) are reduced, providing improved electrical performance of patterned conductive structure 5.

In the embodiment of FIG. 1, dielectric patch 30 extends over at least a portion of one or more conductive areas 21. In an alternative embodiment illustrated in FIG. 2, dielectric patch 30 formed over conductive polymer layer 20 on substrate 40 does not extend over conductive areas 21 and extends only over one or more of deactivated areas 22. Similarly, conductive wire 50 extends over only one or more of deactivated areas 22. In an alternative embodiment (not shown), conductive wire 50 extends over one or more of conductive areas 21 but is electrically isolated from conductive areas 21 by dielectric patch 30.

Figure 2:
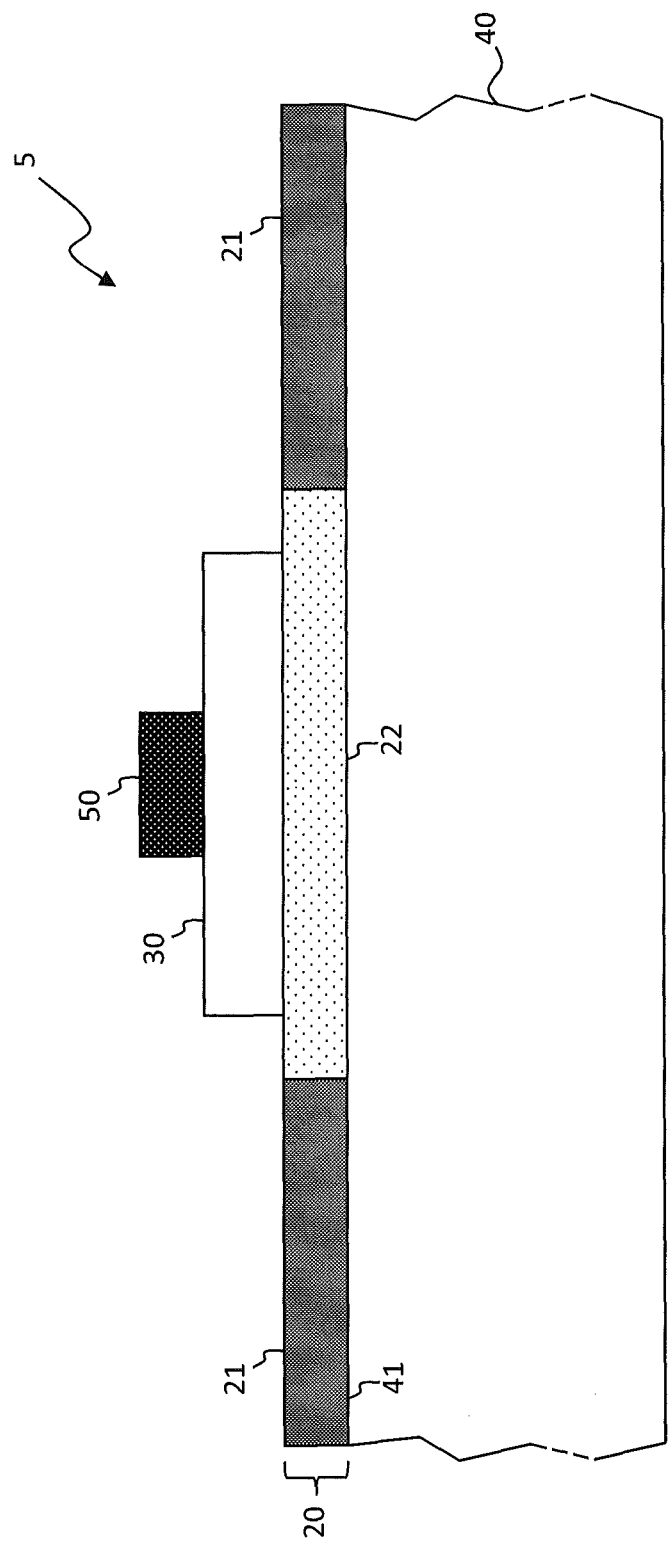
FIG. 2 is another cross section of an embodiment of the present invention.
Figure 3:
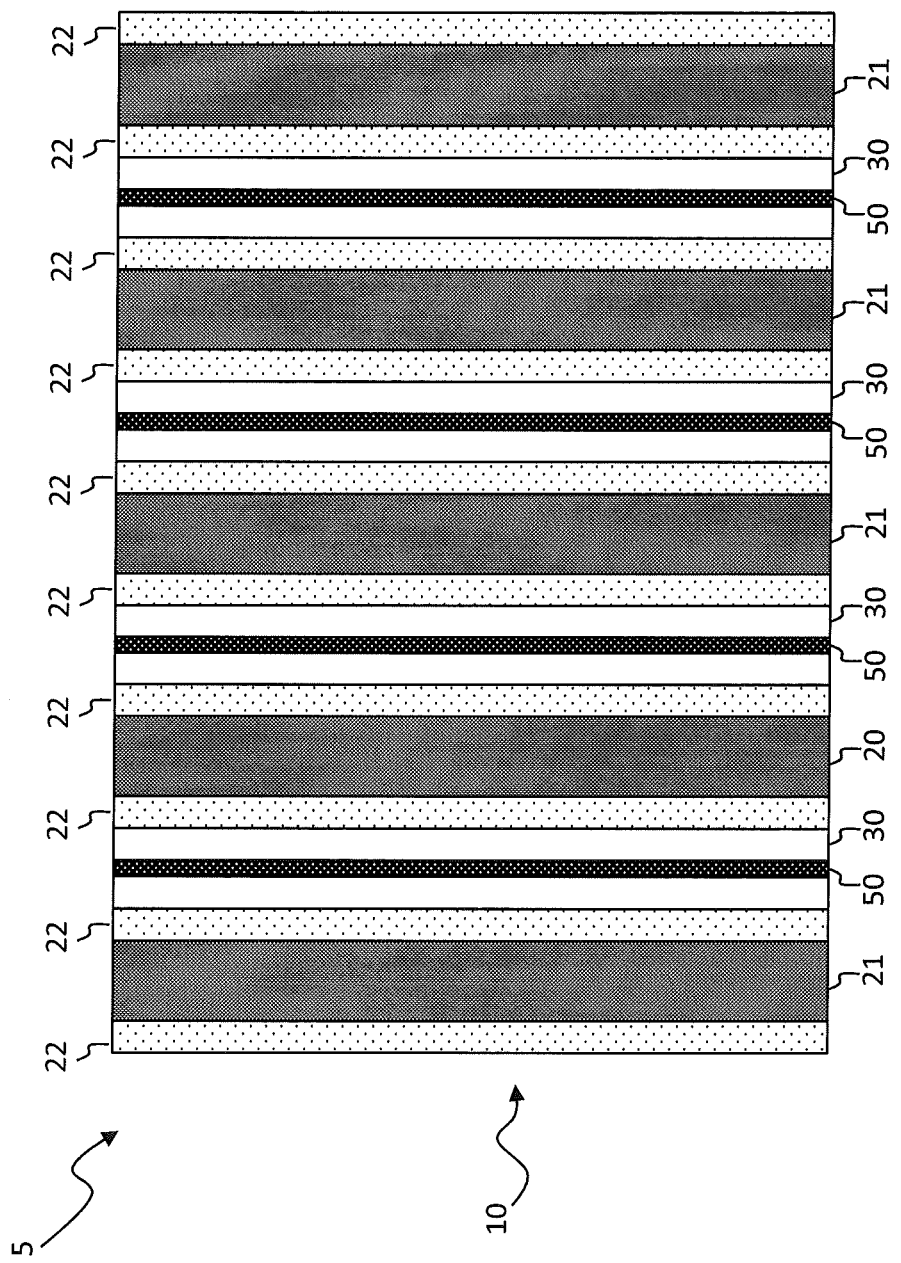
FIG. 3 is a plan view of an embodiment of the present invention corresponding to FIG. 2.
Figure 4:
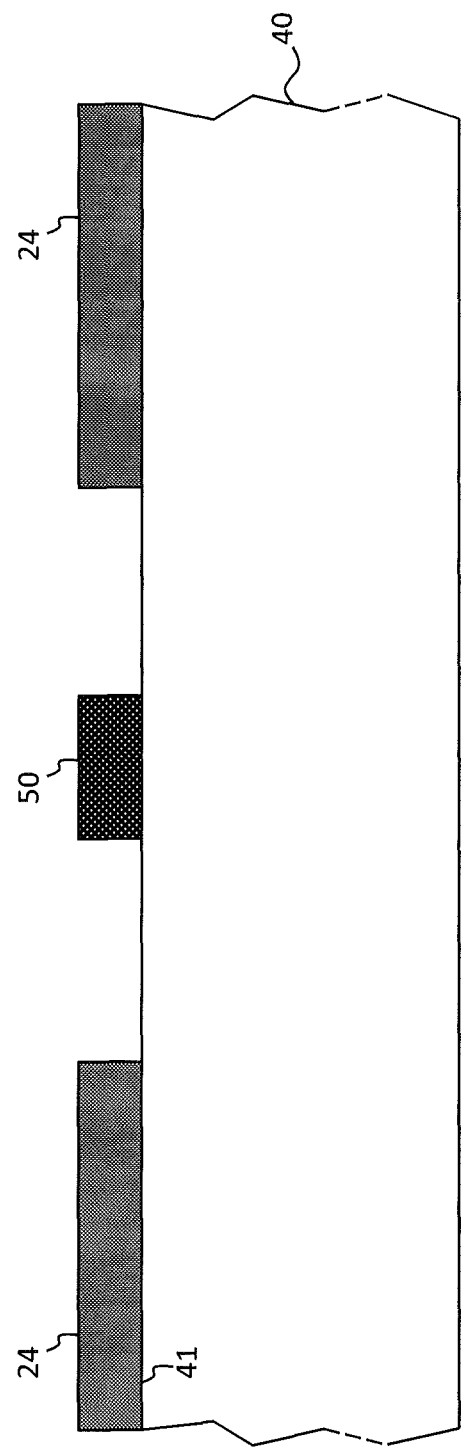
FIG. 4 is a cross section of a patterned conductive structure known in the prior art.

FIG. 3 is a plan view of a conductive polymer layer 20 having conductive areas 21 and deactivated areas 22 in a conductive pattern 10 with dielectric patches 30 and wires 50, corresponding to the embodiment of FIG. 2.

The present invention provides an advantage over the prior art in that one or more of substrates 40, conductive polymer layers 20, dielectric patches 30, or conductive wires 50 can be transparent or relatively flexible. Thus, in an embodiment, patterned conductive structure 5 is flexible. In another embodiment, substrate 40, conductive polymer layer 20, or dielectric patch 30 is transparent.

In various embodiments, substrate 40 is transparent or can include glass or plastic, conductive polymer layer 20 can include polyethylene dioxythiophene (PEDOT), dielectric patch 30 can include electrically insulating polymers, resins, oxides (for example PMMA or titanium oxide and especially materials deposited at low temperatures compatible with polymers), and conductive wires 50 can include metal or metal alloys, for example silver, tin, copper, gold, tantalum, aluminum, or titanium, or carbon. Conductive wires 50 can include metal particles, nano-particles or shells with metal exteriors. Conductive wires 50 can be deposited as particles in a liquid carrier and cured, for example by heating or radiation. Conductive wires 50 can include conductive particles that are sintered, welded, or agglomerated together.

In an embodiment, conductive polymer layer 20 is deposited as a single layer and is pattern-wise processed to form conductive areas 21 and deactivated areas 22. In one embodiment, conductive polymer layer 20 is deposited as a liquid and dried to form a relatively electrically conductive layer and then pattern-wise exposed to an agent (e.g. a chemical in gaseous or liquid form, or energetic particles) to render areas exposed to the agent less electrically conductive, thereby forming deactivated areas 22. Areas not exposed are not rendered less electrically conductive and form conductive areas 21.

Figure 6:
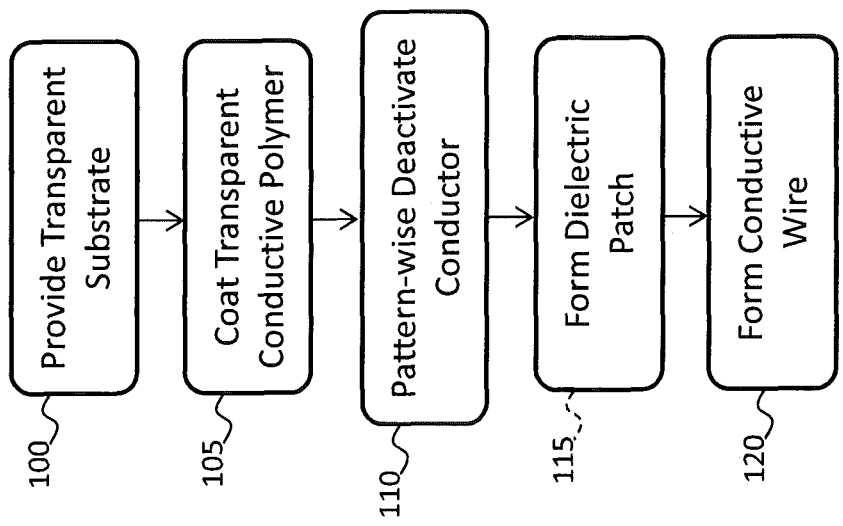
FIG. 6 is a flow chart illustrating a method of making the present invention.

Referring to FIG. 6, in an embodiment of the present invention, a substrate 40 is provided 100 and coated 105 with a conductive polymer layer 20 having a relatively high electrical conductivity. The conductive polymer layer 20 is pattern-wise exposed 110 to a deactivating agent to form conductive areas 21 and deactivated areas 22. A dielectric patch 30 is formed 115 over one or more deactivated areas 22 but over less than all of conductive polymer layer 20. Conductive wire 50 is formed 120 over one or more deactivated areas 22.

In an alternative embodiment, conductive polymer layer 20 is deposited as a liquid and dried to form a relatively less electrically conductive layer and then pattern-wise exposed to an agent (e.g. a chemical in gaseous or liquid form, or energetic particles) to render areas exposed to the agent more electrically conductive, thereby forming conductive areas 21. Areas not exposed are not rendered more electrically conductive and form deactivated areas 22.

Figure 7:
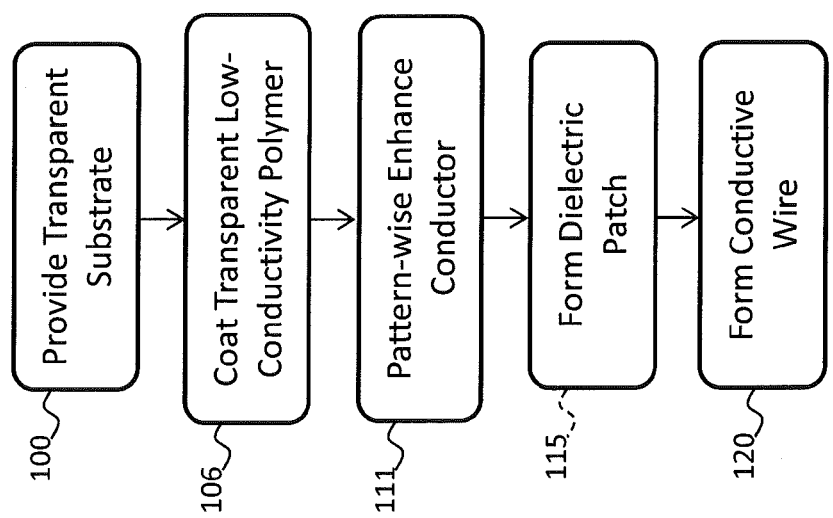
FIG. 7 is a flow chart illustrating another method of making the present invention.

Referring to FIG. 7, in an embodiment of the present invention, a substrate 40 is provided 100 and coated 106 with a conductive polymer layer 20 having a relatively low electrical conductivity. The conductive polymer layer 20 is pattern-wise exposed 111 to a conductivity enhancing agent to form conductive areas 21 and deactivated areas 22. A dielectric patch 30 is formed 115 over one or more deactivated areas 22 but over less than all of conductive polymer layer 20. Conductive wire 50 is formed 120 over one or more deactivated areas 22.

Conductive polymer layer 20 can include conjugated polymers that provide relatively high electrical conductivity in conductive polymer layer 20. A deactivating agent can disrupt the conjugation, thereby rendering the exposed conjugated polymers less electrically conductive. Alternatively, exposure to a deactivating agent can oxidize the exposed molecules, likewise rendering the exposed molecules less electrically conductive. Thus, in an embodiment a coated conductive polymer layer 20 is initially relatively more electrically conductive and portions of conductive polymer layer 20 are rendered less electrically conductive, forming deactivated areas 22. Unexposed areas remain relatively more electrically conductive and form conductive areas 21.

Alternatively, conductive polymer layer 20 can include conjugated polymer in a dispersion having co-dispersed polymers that provide relatively low electrical conductivity in conductive polymer layer 20. An enhancing agent can remove the co-dispersed polymers from the conjugated polymers, forming a more concentrated dispersion of conjugated polymer, thereby rendering the exposed area more electrically conductive. Thus, in another embodiment, a coated conductive polymer layer 20 is initially less electrically conductive and portions of conductive polymer layer 20 are rendered more electrically conductive, forming conductive areas 21. Unexposed areas remain relatively less electrically conductive and form deactivated areas 22.

In various embodiments, the deactivating agent can be, for example, bleach (sodium hypochlorite) or dichloroisocyanuric acid. In various embodiments the enhancing agent is ethylene glycol, or diethylene glycol. A co-dispersed polymer is polystyrenesulfonate.

In various embodiments of the present invention, conductive wire 50 has a width less than or equal to 1 millimeter, 100 microns, 50 microns, or 25 microns. Dielectric patch 30 has dimensions of square mm, 1 square mm, or less. Conductive polymer layer 20 is 50 microns, 20 microns, 10 microns, or less in thickness. Conductive areas 21 and deactivated areas 22 forming conductive pattern 10 can have dimensions of less than 1 mm, 100 microns, 50 microns, 20 microns, or 10 microns.

Conductive polymer layer 20 can be coated in a single step over substrate 40. For example, conductive polymer layer 20 is spin coated, dip coated, rod coated, or slot coated and can include multiple layers. Such coating methods are known in the art.

Dielectric patch 30 can be blanket coated and then patterned, for example using known coating and photo-lithographic processes. Alternatively, dielectric patch 30 is pattern-wise deposited, for example, using screen printing or inkjet deposition.

A patterned conductive structure 5 has been formed by printing a transparent dielectric patch 30 over a layer of PEDOT 20 with conductive silver lines printed over the transparent dielectric patch 30 that are electrically isolated from the layer of PEDOT 20.

In various embodiments, conductive wire 50 can include metal particles, for example nano-particles. The metal particles are sintered to form a metallic electrical conductor. The metal is silver or a silver alloy or other metals, such as tin, tantalum, titanium, gold, copper, or aluminum, or alloys thereof. Conductive wire 50 can include light-absorbing materials such as carbon black, a dye, or a pigment.

Any of conductive polymer layer 20, dielectric patch 30, or conductive wire 50 can be deposited or coated as a liquid and then cured, for example by drying, heating, or irradiation.

Electrically patterned conductive structures 5 and methods of the present invention are useful for making electrical conductors and busses for transparent electrodes and electrical conductors in general, for example as used in busses. A variety of conductive patterns in conductive polymer layer 20 can be used and the present invention is not limited to any one pattern. Patterned conductors can be spaced apart, form separate electrical conductors, or intersect to form a mesh electrical conductor in substrate 40. Patterned conductors can be identical or have different sizes, aspect ratios, or shapes. Similarly, patterned conductors can be identical or have different sizes, aspect ratios, or shapes, and can be straight or curved.

According to various embodiments of the present invention, a substrate 40 is any material having a substrate surface 41 on which conductive polymer layer 20 is coated. For example, glass and plastic are suitable materials known in the art from which substrates 40 is made into sheets of material having substantially parallel opposed sides, one of which is substrate surface 41. A substrate 40 of the present invention is large enough for a user to directly interact therewith, for example with an implement such as a stylus or with a finger or hand. The substrates of integrated circuits are too small for such interaction. Substrates and their manufacture are known in the art.

In a useful embodiment, substrate 40 has a transparency of greater than 90%, 80% 70% or 50% in the visible range of electromagnetic radiation. Substrate 40 is a rigid or a flexible substrate made of, for example, a glass or polymer material, and can have opposing substantially parallel and extensive surfaces. Transparent substrates 40 can include a dielectric material useful for capacitive touch screens and can have a wide variety of thicknesses, for example 10 microns, 50 microns, 100 microns, 1 mm, or more. In various embodiments of the present invention, transparent substrates 40 are provided as a separate structure or are coated on another underlying substrate, for example by coating a polymer substrate layer 20 on an underlying glass substrate. Substrate 40 can be an element of other devices, for example the cover or substrate of a display or a substrate, cover, or dielectric layer of a touch screen.

Conductive inks including metallic particles are known in the art. In useful embodiments, the conductive inks include nano-particles, for example silver, in a carrier fluid such as an aqueous solution. The carrier fluid can include surfactants that reduce flocculation of the metal particles. Once deposited, the conductive inks are cured, for example by heating. The curing process drives out the solution and sinters the metal particles to form a metallic electrical conductor. In other embodiments, the conductive inks are powders that are pattern-wise transferred to a substrate and cured or are powders coated on a substrate and pattern-wise cured. Conductive inks are known in the art and are commercially available.

In any of these cases, conductive inks or other conducting materials are conductive after they are cured and any needed processing completed. Deposited materials are not necessarily electrically conductive before patterning or before curing. As used herein, an electrically conductive ink or polymer is a material that is electrically conductive after any final processing is completed and the conductive ink or polymer is not necessarily conductive at any other point in patterned conductive structure 5 formation process.

Patterned conductive structures 5 of the present invention are useful, for example in displays and in touch screens such as projected-capacitive touch screens that use transparent micro-wire electrodes and in displays. Patterned conductive structures 5 can be located in areas other than display areas, for example in the perimeter of the display area of a touch screen, where the display area is the area through which a user views a display.

Electrically conductive wires 50 operate to conduct electricity or form an electrical field along the length of conductive wires 50. Integrated circuit controllers or power supplies can be electrically connected with electrically conductive wires 50 to provide electrical energy.

Methods and device for forming and providing substrates, coating substrates, patterning coated substrates, or pattern-wise depositing materials on a substrate are known in the photo-lithographic arts. Likewise, tools for laying out electrodes, conductive traces, and connectors are known in the electronics industry as are methods for manufacturing such electronic system elements. Hardware controllers for controlling touch screens and displays and software for managing display and touch screen systems are well known. These tools and methods are usefully employed to design, implement, construct, and operate the present invention. Methods, tools, and devices for operating capacitive touch screens can be used with the present invention.

The present invention is useful in a wide variety of electronic devices. Such devices can include, for example, photovoltaic devices, OLED displays and lighting, LCD displays, plasma displays, inorganic LED displays and lighting, electrophoretic displays, electrowetting displays, dimming mirrors, smart windows, transparent radio antennae, transparent heaters and other touch screen devices such as resistive touch screen devices.

The invention has been described in detail with particular reference to certain embodiments thereof, but it will be understood that variations and modifications can be effected within the spirit and scope of the invention.

PARTS LIST 5 patterned conductive structure
10 conductive pattern
20 conductive polymer layer
21 conductive area
22 deactivated area
24 transparent conductive oxide
30 dielectric patch
40 substrate
41 substrate surface
50 wire
60 leakage current
100 provide transparent substrate step
105 coat transparent conductive polymer step
106 coat transparent low-conductivity polymer step
110 pattern-wise deactivate conductor step
111 pattern-wise enhance conductor step
115 form dielectric patch step
120 form conductive wire step

The invention claimed is:

1. A patterned conductive structure, comprising:
    a substrate having a substrate surface;
    a conductive polymer layer formed on the substrate surface, the conductive polymer layer having electrically conductive areas and deactivated areas that are less electrically conductive than the conductive areas, the conductive areas and the deactivated areas forming a conductive pattern in the conductive polymer layer;
    one or more dielectric patches that are less electrically conductive than the deactivated areas formed over less than all of the conductive polymer layer and over at least a portion of one or more deactivated areas; and
    one or more conductive wires formed over at least one of the dielectric patches.

2. The patterned conductive structure of claim 1, wherein at least one of the conductive wires is located only over one or more of the deactivated areas.

3. The patterned conductive structure of claim 1, wherein at least one of the dielectric patches extends over at least a portion of one or more of the conductive areas.

4. The patterned conductive structure of claim 1, wherein at least one of the dielectric patches extends over only one or more of the deactivated areas.

5. The patterned conductive structure of claim 1, wherein the substrate, conductive polymer layer, or dielectric patch is transparent.

6. The patterned conductive structure of claim 1, wherein both the conductive area and the deactivated area include conjugated polymers.

7. The patterned conductive structure of claim 1, wherein the conjugated polymers include polyethylene dioxythiophene (PEDOT).

8. The patterned conductive structure of claim 1, wherein both the conductive area and the deactivated area include the same conjugated polymers.

9. The patterned conductive structure of claim 1, wherein the deactivated area includes conjugated polymers with disrupted conjugation or increased oxidation.

10. The patterned conductive structure of claim 1, wherein the conductive area has a higher concentration of conjugated polymers than the deactivated areas.

11. The patterned conductive structure of claim 1, wherein the dielectric patches are a polymer resin or an oxide.

12. The patterned conductive structure of claim 1, wherein the conductive wires include silver, aluminum, carbon, or tin.

13. The patterned conductive structure of claim 1, wherein the conductive wires include conductive particles that are sintered, welded, or agglomerated together.

14. The patterned conductive structure of claim 1, wherein the substrate, conductive polymer layer, or dielectric patch is flexible.

15. A method of making a patterned conductive structure, comprising:
    providing a substrate having a substrate surface;
    providing a conductive polymer layer on the substrate surface;
    pattern-wise exposing the conductive polymer layer to an agent to electrically transform portions of the conductive polymer layer to form electrically conductive areas and deactivated areas that are less electrically conductive than the conductive areas, the conductive areas and the deactivated areas forming a conductive pattern in the conductive polymer layer;
    forming one or more transparent dielectric patches that are less electrically conductive than the deactivated areas over at least a portion of one or more deactivated areas; and
    forming one or more conductive wires over at least one of the dielectric patches.

16. The method according to claim 15, wherein the agent is an electrical-conductivity deactivating agent and further including pattern-wise exposing the transparent conductive polymer layer to deactivate exposed areas of the transparent conductive polymer layer so that the deactivated areas have less electrical conductivity than the areas that are not exposed.

17. The method according to claim 15, wherein the agent is an electrical-conductivity enhancing agent and further including pattern-wise exposing the transparent conductive polymer layer to enhance the electrical conductivity of exposed areas of the transparent conductive polymer layer so that the enhanced areas have greater electrical conductivity than the areas that are not exposed.

18. The method according to claim 15, wherein the step of forming one or more transparent dielectric patches further includes depositing a material on the conductive polymer layer.

* * * * *